(12) United States Patent
Vollrath et al.

(10) Patent No.: US 6,737,671 B2
(45) Date of Patent: May 18, 2004

(54) CURRENT MEASUREMENT CIRCUIT AND METHOD FOR VOLTAGE REGULATED SEMICONDUCTOR INTEGRATED CIRCUIT DEVICES

(75) Inventors: Joerg Vollrath, Olching (DE); Philip Moore, Richmond, VA (US); Ulrich Zimmermann, Ottendorf-Okrilla (DE)

(73) Assignee: Infineon Technologies Richmond, LP, Sandston, VA (US)

( * ) Notice: Subject to any disclaimer, the term of this patent is extended or adjusted under 35 U.S.C. 154(b) by 28 days.

(21) Appl. No.: 10/180,254

(22) Filed: Jun. 26, 2002

(65) Prior Publication Data

US 2004/0002174 A1 Jan. 1, 2004

(51) Int. Cl.[7] .............................................. H01L 23/58
(52) U.S. Cl. ........................... 257/48; 438/18; 324/522; 324/523
(58) Field of Search ............................ 257/48; 438/18; 324/522, 523, 527, 532, 535

(56) References Cited

U.S. PATENT DOCUMENTS 6,195,772 B1 * 2/2001 Mielke et al. ............... 714/724

FOREIGN PATENT DOCUMENTS

JP 363133559 A * 11/1986

* cited by examiner

Primary Examiner—Douglas Wille

(57) ABSTRACT

A current measurement circuit and method for testing a semiconductor device is provided. The method includes the steps of providing a semiconductor integrated circuit device including a voltage regulating circuit, the voltage regulating circuit being activated as needed to maintain a required voltage level; monitoring the voltage regulating circuit to determine a number of times it is activated during a sample period; and comparing the number of activations to a predetermined limit whereby if the number of activations exceeds the predetermined limit the semiconductor device is defective. The current measurement circuit includes an external clock for providing a clock signal; a first counter for counting when the voltage regulating circuit is activated; a second counter for counting clock cycles of a sample period; and a register for storing the number of activations, wherein the number of activations represents a relative current consumption value of the semiconductor device.

11 Claims, 3 Drawing Sheets

CURRENT MEASUREMENT CIRCUIT AND METHOD FOR VOLTAGE REGULATED SEMICONDUCTOR INTEGRATED CIRCUIT DEVICES

BACKGROUND OF THE INVENTION

1. Field of the Invention

The present invention relates generally to semiconductor device testing, and more particularly, to a current measurement circuit and current measurement method for determining the quality of a semiconductor integrated circuit device.

2. Description of the Related Art

Integrated circuits containing very large numbers of devices such as transistors must be tested for defects before they are shipped to customers. A technique called "IDDQ testing" is commonly used in defect testing of integrated circuits containing CMOS devices. IDDQ testing is performed by stopping all clock signals applied to the device under test (DUT). This places the DUT in a quiescent state in which the current flow through the DUT is characterized by a so-called "IDDQ" quiescent current in contrast to the "IDDD" dynamic current which flows during normal clocked operation of the DUT. Various defects or faults can be detected by measuring IDDQ current flow through the DUT when the DUT is in the quiescent state, and comparing the measured IDDQ value to predefined values representative of IDDQ current values for similar devices which are known to be either defective or defect-free. IDDQ testing can be used to detect faults such as bridging faults, transistor stuck-open faults, or gate oxide leaks, which increase the normally low IDDD.

Typically, IDDQ testing is performed by automated test equipment (ATE) which places the DUT in the quiescent state by applying a test pattern electronic signal to the DUT. A parametric measurement unit (PMU) or high precision ammeter is then used to measure the IDDQ current flowing through the DUT. This is an extremely slow technique, in that only a small number of measurements can be included in a production test.

SUMMARY OF THE INVENTION

Accordingly, it is an objective of the present invention to provide a current measurement circuit and method for determining the quality of a semiconductor device which reduces testing time.

It is another aspect of the present invention to provide an on-chip current measurement circuit and method thereof for determining the quality of a semiconductor device which eliminates the need for expensive, external automated test equipment (ATE).

According to one aspect of the present invention, a method for testing a semiconductor device is provided including the steps of providing an integrated circuit including a voltage regulating circuit, the voltage regulating circuit being activated as needed to maintain a required voltage level of the integrated circuit; applying an external voltage to the integrated circuit; monitoring the voltage regulating circuit to determine a number of times it is activated during a sample period; and comparing the number of activations to a predetermined limit whereby if the number of activations exceeds the predetermined limit the semiconductor device is defective.

According to another aspect of the present invention, a semiconductor device including a circuit for determining the quality of the semiconductor device is provided. The semiconductor device includes a voltage regulating circuit for regulating an external voltage to a required internal voltage, the voltage regulating circuit being activated as needed to maintain the required internal voltage; and a current measurement circuit for determining a number of times the voltage regulating circuit is activated and comparing the number of activations to a predetermined limit to determine if the semiconductor device is defective, wherein the number of activations represents a relative current consumption value of the semiconductor device.

According to a further aspect of the present invention, a circuit for determining the quality of a semiconductor device is provided. The circuit includes a current measurement circuit for determining a number of times a voltage regulating circuit of the semiconductor device is activated and comparing the number of activations to a predetermined limit to determine if the semiconductor device is defective, wherein the number of activations represents a relative current consumption value of the semiconductor device. The current measurement circuit includes an external clock for providing a clock signal; a first counter for counting when the voltage regulating circuit is activated; a second counter for counting clock cycles of a sample period; and a register for storing the number of activations from the first counter. Additionally, the voltage regulating circuit being a voltage pump system or a transistor.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Preferred embodiments of the present invention will be described herein below with reference to the accompanying drawings. In the following description, well-known functions or constructions are not described in detail since they would obscure the invention in unnecessary detail.

The present invention is directed to a circuit and method for determining the quality of semiconductor integrated circuit devices. The circuit and method are utilized with integrated circuits including voltage regulating circuits. By monitoring the voltage regulating circuit of the device, a relative current value can be measured. The current value is then compared to a predetermined minimum and maximum value and, if the current value is within the limits, the device is deemed good. Otherwise, if the measured current value falls outside the limits, the device is deemed defective.

Figure 1:
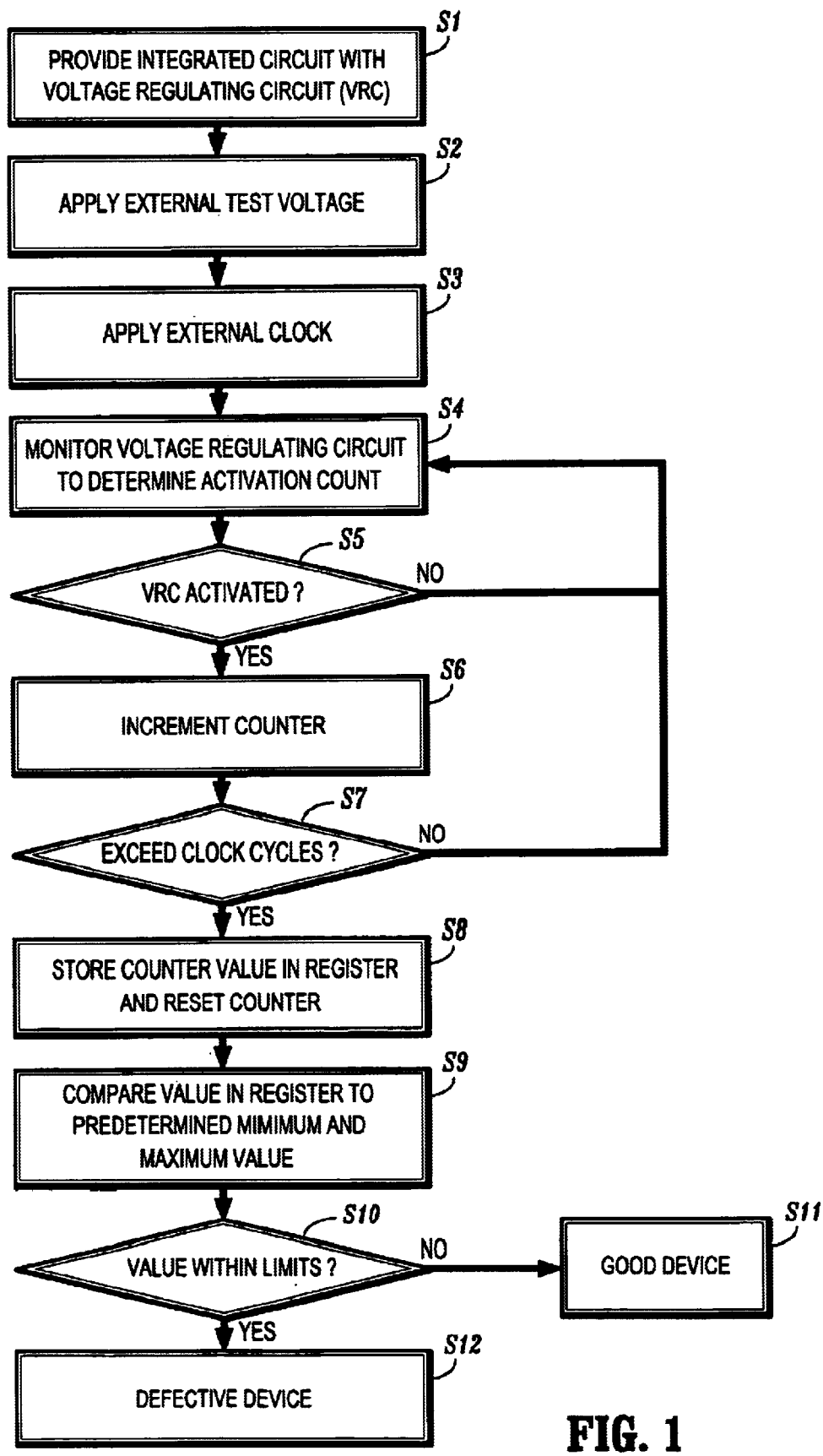
FIG. 1 is a flowchart illustrating a method for testing a semiconductor integrated circuit device in accordance with the present invention.

Referring to FIG. 1, a method for testing a semiconductor integrated circuit device in accordance with the present invention is provided. In Step S1, a semiconductor integrated circuit device, or chip, with a voltage regulating circuit is provided. There are two major voltage regulation schemes employed on state of the art chips. First, a voltage pump system is utilized to generate higher or lower internal voltages from a specific externally supplied voltage, and second, transistor voltage regulators are utilized to regulate external voltages to a lower value. The method of the present invention addresses both of these schemes and a current measurement circuit embodied in an integrated circuit of both schemes will be described below.

With continued reference to FIG. 1, an external test voltage is applied to the integrated circuit in Step S2 which will be processed by the voltage regulating circuit. In operation, the voltage regulating circuit will be activated as needed to maintain internal voltage levels of the device. In Step S3, an external clock signal is applied to the device and, at every rising clock edge, the voltage regulating circuit is monitored to determine if it has been activated (Step S4). If the voltage regulating circuit has been activated (Step S5), a counter will be incremented in Step S6, or otherwise, the voltage regulating circuit will continue to be monitored.

The voltage regulating circuit is monitored for a sample period defined by a predetermined number of clock cycles. When the clock cycles of the sample period is exceeded (Step S7), the value being incremented in the counter is stored in a register and the counter is reset in Step S8. The value stored in the register will be proportional to current consumption of the device. In Step S9, the value stored in the register is compared to known acceptable minimum and maximum values of good devices and, if the measured value is within the limits (Step S10), the device is deemed good (Step S11). Otherwise, if the measured current value is outside the acceptable limits, the device is deemed defective (Step S12).

Figure 2:
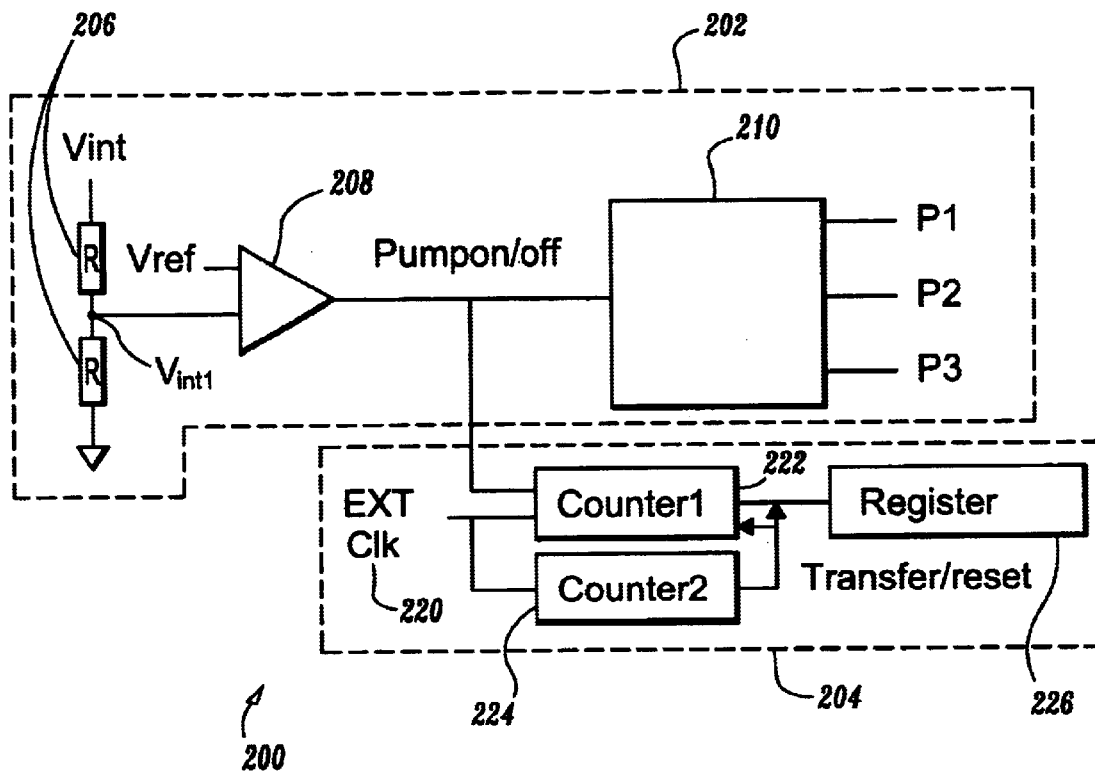
FIG. 2 is a schematic diagram of a first embodiment of a semiconductor device employing a current measurement circuit in accordance with the present invention.
Figure 3:
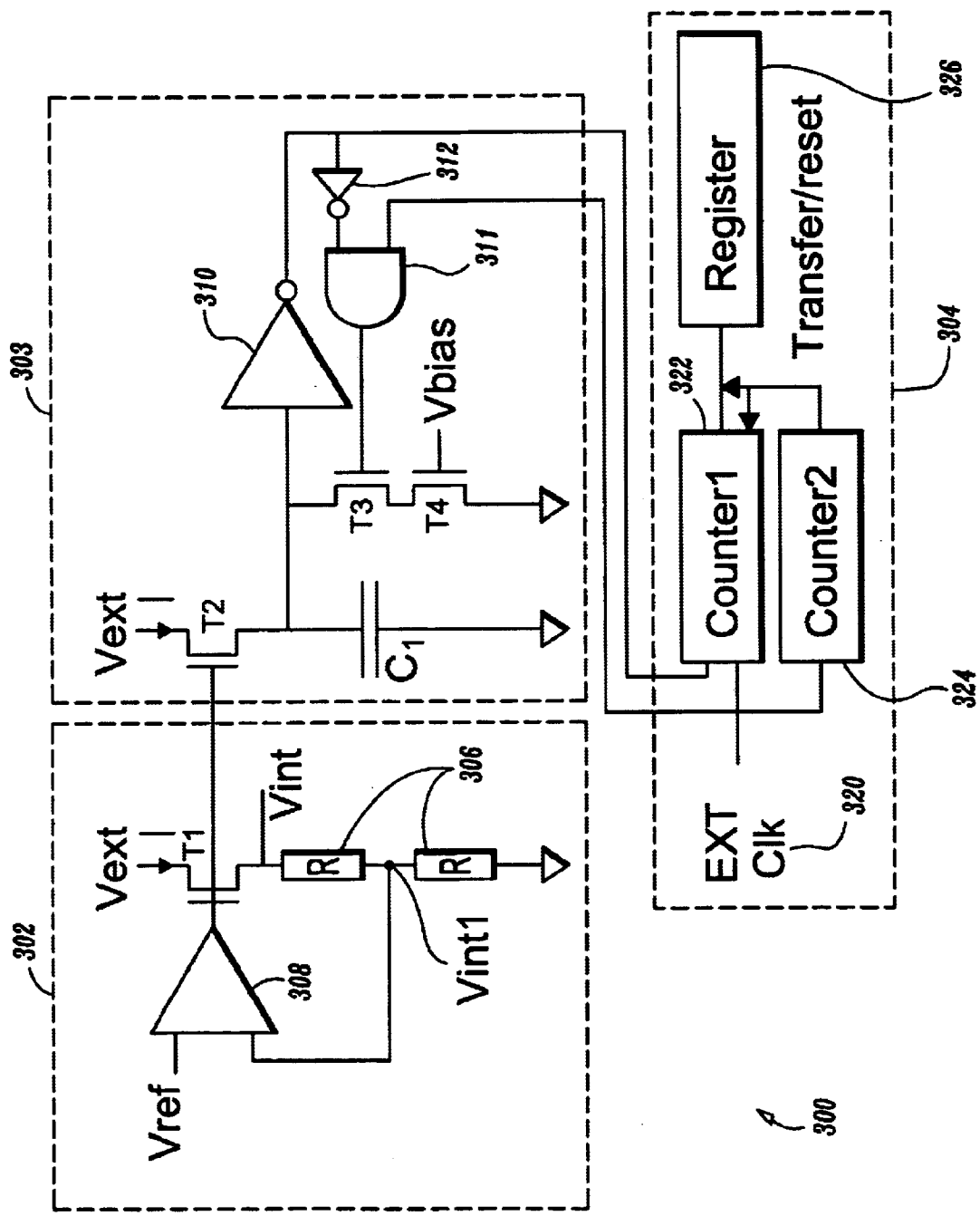
FIG. 3 is a schematic diagram of a second embodiment of a semiconductor device employing a current measurement circuit in accordance with the present invention

Referring to FIGS. 2 and 3, in which like reference numerals identify similar or identical elements throughout the several views, a current measurement circuit for determining the quality of semiconductor integrated circuit devices including voltage regulating circuits is provided. FIG. 2 illustrates the current measurement circuit utilized with a voltage pump system and FIG. 3 illustrates the current measurement circuit utilized with a transistor voltage regulator.

Figure 2A:
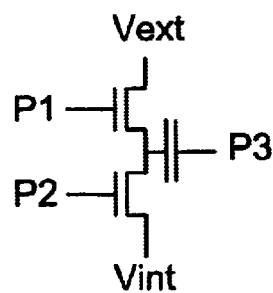
FIG. 2A is a schematic diagram of the charge pump circuit shown in FIG. 2.

Integrated circuit 200 includes voltage pump system 202 and current measurement circuit 204 as shown in FIG. 2. The voltage pump system 202 includes a voltage divider 206 dividing an internal voltage Vint to a predetermined level; a comparator 208 comparing the divided voltage outputted from the voltage divider 206 with a reference voltage Vref, and outputting a control signal Pump_on/off; and a charge pump circuit 210 including a ring oscillator and a charge pump for performing a pumping operation and outputting the desired internal voltage Vint. FIG. 2A is an exemplary charge pump. The charge pump circuit 210 generates a pulse needed for the charge pump in FIG. 2A. In use, comparator 208 compares the divided voltage Vint1 of the voltage divider 206 with a desired voltage Vref and, if the voltages do not match, the comparator 208 sends control signal Pump_on/off to the charge pump circuit 210 to turn the charge pump on until Vint reaches the desired level. It is to be understood that if there is more than one voltage pump system, either the Pump_on/off signal can be multiplexed or there can be more than one current measurement circuit.

The current measurement circuit 204 of FIG. 2 includes an external clock 220 for providing a clock signal, a first counter 222 for counting when the voltage regulating circuit 202 is activated, a second counter 224 for counting clock cycles of a sample period, and a register 226 for storing a value from the first counter 222.

When testing the integrated circuit 200 of FIG. 2, an external voltage Vext is applied and the charge pump circuit 210 is turned on or activated by the comparator 208 until the desired internal voltage Vint is achieved. The Pump_on/off signal, which activates the charge pump circuit 210, is coupled to the first counter 222 and is sampled at every rising clock edge of the external clock signal applied by the external clock 220. If the comparator 208 generates an "on" signal, the first counter 222 is incremented. The second counter 224 also receives the external clock signal and is incremented every clock cycle. When the second counter 224 reaches a predetermined number of clock cycles which defines the sample period, the second counter initiates a transfer/reset signal which results in the incremented value of the first counter 222 being transferred to register 226 and the first counter 222 being reset.

The value stored in register 226 will be proportional to the current consumption of the integrated circuit 200. For high current consumption, e.g., if there is leakage in the device, the charge pump circuit 210 will be on for a longer period of time, and therefore, the first counter 222 will count to a higher value. Once stored, the register value is transferred out of the chip to a test system. For a given chip, a minimum and maximum value is established and, if the register value is within the minimum and maximum value, the chip is deemed good. Alternatively, if the register value is outside the range of the minimum and maximum value, the chip is considered defective. High count values may result from a bridging short between Vint and ground which can lead to excessive current or may result from an open to a transistor gate, resulting in a floating gate where current can flow through the transistor even in the presumed off state. Furthermore, low count values may be provided from a faulty voltage pump system resulting in components of the device not receiving the required voltages and, therefore, the components are unable to perform their functions.

Referring to FIG. 3, the second embodiment 300 of the present invention includes voltage regulating circuit 302, current detecting circuit 303 and current measurement circuit 304. The voltage regulator 302 converts an external voltage Vext using a large FET transistor T1 (p-type or n-type) resulting in a desired internal voltage Vint. Reference voltage Vref is compared by comparator 308 to divided voltage Vint1 outputted from voltage divider 306. If divided voltage Vint1 is too low, transistor T1 is opened to provide current to increase internal voltage Vint to the desired level.

Current detecting circuit 303 will monitor the voltage regulator 302 and generate a number of pulses proportional to the current through transistor T1. The current detecting circuit 303 includes a plurality of transistors T2, T3, T4, capacitor C1, inverters 310, 312 and AND gate 311. The current of transistor T2 will be proportional to the current of transistor T1 since they have the same threshold voltage. The voltage at capacitor C1 is increased by the current through transistor T2 and decreased via transistor T3 as soon as a switchpoint of inverter 310 is reached and a clock signal is high. At every rising clock edge of an external clock signal applied by external clock 320, a first counter 322 in measurement circuit 304 will be incremented, if the output of the inverter 310 is high. The number of generated pulses is proportional to the current through transistor T1 and transistor T2.

Similar to the current measurement circuit of the first embodiment, current measurement circuit 304 includes external clock 320 for providing the clock signal, first counter 322 for counting when the voltage regulating circuit 302 is activated, a second counter 324 for counting clock cycles of a sample period, and a register 326 for storing a value from the first counter 322. At every rising clock edge of the external clock signal applied by the external clock 320, the current detecting circuit 303 will be sampled and, if a pulse is generated, the first counter 322 is incremented. The second counter 324 also receives the external clock signal and is incremented every clock cycle. When the second counter 324 reaches a predetermined number of clock cycles which defines the sample period, the second counter initiates a transfer/reset signal which results in the incremented value of the first counter 322 being transferred to register 326 and the first counter 322 being reset.

The value stored in register 326 will be proportional to the current consumption of the integrated circuit 300. Once stored, the register value is transferred out of the chip to a test system. For a given chip, a minimum and maximum value is established and, if the register value is within the minimum and maximum value, the chip is deemed good. Alternatively, if the register value is outside the range of the minimum and maximum value, the chip is considered defective.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A semiconductor device including a circuit for determining the quality of the semiconductor device, the semiconductor device comprising:

a voltage regulating circuit for regulating an externally applied voltage to a required internal voltage, the voltage regulating circuit being activated as needed to maintain the required internal voltage; and a current measurement circuit for monitoring the voltage regulating circuit and determining a number of times the voltage regulating circuit is activated and comparing the number of activations to a predetermined limit to determine if the semiconductor device is defective where the number of activations represents a relative current consumption value of the semiconductor device.

2. The semiconductor device as in claim 1, wherein the current measurement circuit further comprises:

an external clock for providing a clock signal;

a first counter for counting when the voltage regulating circuit is activated;

a second counter for counting clock cycles of a sample period; and a register for storing the number of activations from the first counter.

3. The semiconductor device as in claim 1, wherein the voltage regulating circuit is a voltage pump system comprising:

a voltage divider for dividing an internal voltage to a predetermined level;

a comparator for comparing the divided voltage outputted from the voltage divider with a reference voltage and outputting a control signal; and a charge pump circuit including a ring oscillator and a charge pump for performing a pumping operation in response to the control signal and outputting the required internal voltage.

4. The semiconductor device as in claim 3, wherein the control signal is indicative of the regulating circuit being activated.

5. The semiconductor device as in claim 1, wherein the voltage regulating circuit is a voltage regulating transistor and the semiconductor device further comprises a current detecting circuit.

6. The semiconductor device as in claim 5, wherein the current detecting circuit comprises a plurality of transistors, a capacitor, a first inverter, a second inverter and an AND gate.

7. The semiconductor device as in 5, wherein the current detecting circuit generates a signal indicative of the voltage regulating transistor being activated.

8. In a semiconductor device including a voltage regulating circuit for regulating an externally applied voltage to a required internal voltage, the voltage regulating circuit being activated as needed to maintain the required internal voltage: a circuit for determining the quality of the semiconductor device, the circuit comprising:

a current measurement circuit for determining a number of times the voltage regulating circuit is activated and comparing the number of activations to a predetermined limit to determine If the semiconductor device is defective, wherein the number of activations represents a relative current consumption value of the semiconductor device.

9. The circuit as in claim 8, wherein the current measurement circuit comprises:

an external clock for providing a clock signal;

a first counter for counting when the voltage regulating circuit is activated;

a second counter for counting clock cycles of a sample period; and a register for storing the number of activations from the first counter.

10. The circuit as in claim 8, wherein the voltage regulating circuit is a voltage pump system.

11. The circuit as in claim 8, wherein the voltage regulating circuit is a transistor.

* * * * *